(12) United States Patent
Chen et al.

(10) Patent No.: US 9,773,671 B1
(45) Date of Patent: Sep. 26, 2017

(54) MATERIAL COMPOSITION AND PROCESS FOR MITIGATING ASSIST FEATURE PATTERN TRANSFER

(71) Applicant: Taiwan Semiconductor Manufacturing Co., Ltd., Hsin-Chu (TW)

(72) Inventors: Meng-Tze Chen, New Taipei (TW); Chen-Hau Wu, New Taipei (TW); Meng-Wei Chen, Taichung (TW); Kuei-Shun Chen, Hsinchu (TW); Yu-Chin Huang, Taipei (TW); Li-Hsiang Lai, Hsinchu (TW); Shih-Ming Chang, Hsinchu County (TW); Ken-Hsien Hsieh, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/169,565

(22) Filed: May 31, 2016

(51) Int. Cl.
| | |
|---|---|
| *H01L 29/06* | (2006.01) |
| *H01L 21/027* | (2006.01) |
| *H01L 27/02* | (2006.01) |
| *G03F 7/16* | (2006.01) |
| *G03F 7/20* | (2006.01) |
| *G03F 7/32* | (2006.01) |

(52) U.S. Cl.
CPC ............ *H01L 21/0274* (2013.01); *G03F 7/16* (2013.01); *G03F 7/20* (2013.01); *G03F 7/32* (2013.01); *H01L 27/0207* (2013.01)

(58) Field of Classification Search
CPC ... H01L 21/0274; H01L 27/0207; G03F 7/20; G03F 7/32; G03F 7/16
USPC .......................................................... 257/618
See application file for complete search history.

(56) References Cited

U.S. PATENT DOCUMENTS

| | | | | |
|---|---|---|---|---|
| 5,741,741 | A * | 4/1998 | Tseng | ................ H01L 21/76813 257/E21.257 |
| 8,715,909 | B2 * | 5/2014 | Gutmann | ................... G03F 1/26 430/311 |
| 8,728,332 | B2 * | 5/2014 | Lin | ..................... H01L 21/0274 216/13 |

* cited by examiner

*Primary Examiner* — Luan C Thai
(74) *Attorney, Agent, or Firm* — Haynes and Boone, LLP

(57) ABSTRACT

Provided is a material composition and method for inhibiting the printing of SRAFs onto a substrate including coating a substrate with a resist layer. After coating the substrate, the resist layer is patterned to form a main feature pattern and at least one sub-resolution assist feature (SRAF) pattern within the resist layer. The main feature pattern may include resist sidewalls and a portion of a layer underlying the patterned resist layer. In various examples, a material composition is deposited over the patterned resist layer and into each of the main feature pattern and the at least one SRAF pattern. Thereafter, a material composition development process is performed to dissolve a portion of the material composition within the main feature pattern and to expose the portion of the layer underlying the patterned resist layer.

20 Claims, 20 Drawing Sheets

Alkyl chain examples

Linear or branch type
MW range 3000~30000

MATERIAL COMPOSITION AND PROCESS FOR MITIGATING ASSIST FEATURE PATTERN TRANSFER

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, scaling down of IC dimensions has been achieved by extending the usable resolution of a given lithography generation by the use of one or more resolution enhancement technologies (RETs), such as phase shift masks (PSMs), off-axis illumination (OAI), and optical proximity correction (OPC). RETs may be used to increase a lithography process window, for example by modification of mask layouts to compensate for processing limitations used in the manufacture of an IC and which manifest themselves as process technology nodes are scaled down. Without RETs, simple scaling down of layout designs used at larger nodes often results in inaccurate or poorly shaped features. For example, rounded corners on a device feature that is designed to have right-angle corners may become more pronounced and/or may become critically distorted at smaller technology nodes, preventing a device with such a distorted feature from performing as desired. Other examples of inaccurate or poorly shaped pattern features may include pinching, necking, bridging, dishing, erosion, metal line thickness variations, and/or other such characteristics that can directly affect device performance. One type of OPC technique includes inserting sub-resolution assist features (SRAFs) into a design layout to prevent inaccurate or poorly shaped features. As a general rule, SRAFs should be small enough so that an SRAF pattern on a mask is not transferred (i.e., printed) onto a substrate during lithographic exposure/development processes. However, larger SRAFs are desirable as they are known to provide better depth of focus (DoF), contrast, and process window than their smaller counterparts. Thus, in some examples, use of mask layouts including SRAFs may result in inadvertently printed SRAFs on the substrate. Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
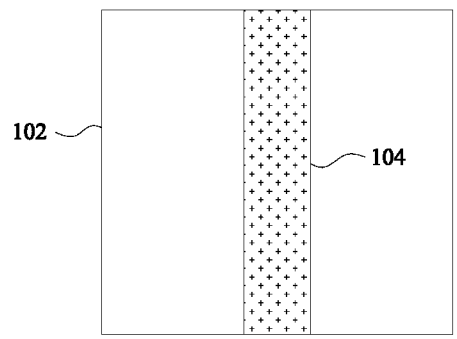
FIG. 1A illustrates a mask having a main feature.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to a sub-resolution assist feature (SRAF) exposure/development method that effectively overcomes the shortcomings of existing methods in which SRAFs may be printed onto a substrate. Specifically, embodiments of the present disclosure provide an assist feature erase material (AFEM) composition. In some embodiments, the AFEM composition is deposited onto a patterned photoresist (resist) layer, where the patterned photoresist layer may include one or more inadvertently printed SRAFs. As described in more detail below, the AFEM composition may be used to effectively "erase" the undesirable printed SRAFs within the resist layer. In at least some embodiments, the term "erase" used in the present disclosure means that undesirable printed SRAFs in the resist layer are effectively removed, as described below, and potentially detrimental effects of such printed SRAFs within a resist layer may be avoided. In some examples, the AFEM composition deposited onto the patterned resist layer serves to fill voids, gaps, and/or other undesirable SRAF patterns which have been printed onto the resist layer. In various embodiments, the AFEM composition and related methods described herein serve to recover depth of focus (DoF), contrast, and process window that would otherwise have been lost due to the undesirable SRAFs printed within the resist layer.

Referring first to FIG. 1A, illustrated therein is a mask 102 having a layout including a main feature 104, while not having SRAFs (e.g., scattering bars). In various embodiments, the main feature 104 may be a portion of an IC design layout and may include various geometrical patterns designed for the fabrication of an IC device. By way of example, the main feature 104 may correspond to a pattern of metal, oxide, or a semiconductor layer that makes up a component of a fabricated IC device. In some examples, the pattern defined by the main feature 104 may be combined with other patterns to form various features of an IC device. In some embodiments, various portions of an IC design layout, including for example the main feature 104, may include features such as an active region, a gate electrode, source and drain regions, metal lines or vias of a metal interconnect, a dielectric, openings for bond pads, as well as other features known in the art which are to be formed within a semiconductor substrate (e.g., such as a silicon wafer) and various material layers disposed on the semiconductor substrate.

Figure 1B:
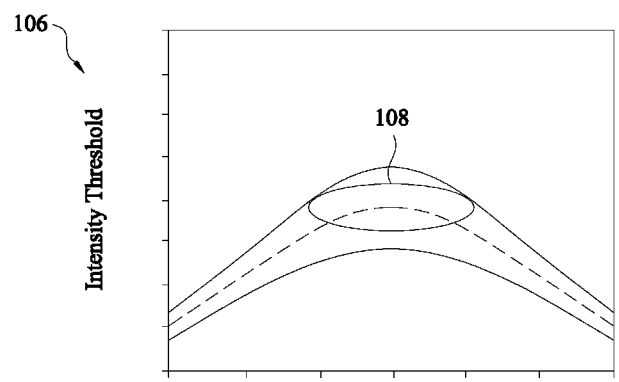
FIG. 1B illustrates a plot that may be used to determine a process window for the mask of FIG. 1A.

FIG. 1B illustrates a plot 106 which may be used to determine a process window, such as a process window 108. As used herein, the term "process window" is used to define a region of focus and exposure (intensity) which provides for a final image patterned into a resist layer that meets defined specifications (e.g., for a given technology node, for a given toolset, etc.). Stated another way, a process window may be used to set upper and lower boundaries on focus and exposure, the range of which will still yield patterned resist layers that meet defined specification limits.

In some examples, the plot 106 includes a Bossung plot, which can be used to visualize focus-exposure matrix data. In some embodiments, the plot 106 and the process window 108 correspond to the mask 102. In the example of FIG. 1B, the plot 106 displays an intensity threshold (e.g., corresponding to an exposure energy intensity) versus a depth of focus (DoF). In some embodiments, "DoF" as used herein, may be defined as a range of focus values that a given process can tolerate (e.g., for a given technology node, for a given toolset, etc.) and still achieve patterned features that fall within a defined specification (e.g., that are within the process window). It will be understood by those skilled in the art that improving (i.e., increasing) the process window size is generally desirable.

Figure 2A:
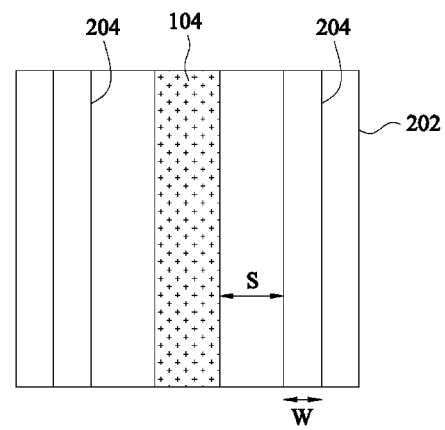
FIG. 2A illustrates a mask having a main feature and sub-resolution assist features (SRAFs)
Figure 2B:
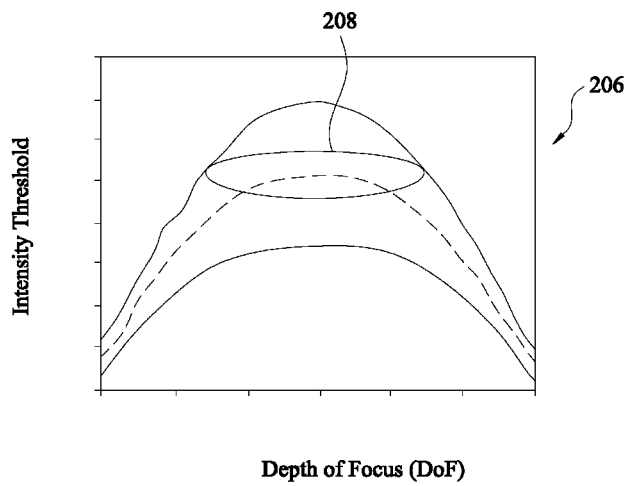
FIG. 2B illustrates a plot that may be used to determine a process window for the mask of FIG. 2A.

By way of example, one way of improving the process window (e.g., including improving the contrast and DoF) is with the use of SRAFs. With reference to FIG. 2A, illustrated therein is a mask 202 having layout including the main feature 104 and SRAFs 204. As described above, the main feature 104 may be a portion of an IC design layout and may include various geometrical patterns designed for the fabrication of an IC device. In some examples, the SRAFs 204 include non-printing features (i.e., features not printed onto an exposed resist layer) adjacent to a main feature (e.g., the main feature 104). In some embodiments, the SRAFs 204 may have a dimension (e.g., width 'W') which is about ⅓ of a minimum feature size (e.g., for a given technology node/process). Additionally, in some embodiments, the SRAFs 204 may be spaced ('S') about a minimum feature size away from an edge of the main feature 104. In various embodiments, the SRAFs 204 may be sized (e.g., width 'W') and spaced 'S' so as to optimize the contrast, DoF, and thus process window for a given main feature (e.g., the main feature 104). FIG. 2B illustrates a plot 206 which may be used to determine a process window 208 (e.g., which corresponds to the mask 202 of FIG. 2A). Comparison of the process window 108 (for the mask 102 which does not have SRAFs) to the process window 208 (for the mask 202 which includes the SRAFs 204) shows how a process window (and contrast, DoF) may be improved (e.g., increased) with the use of SRAFs.

Generally, SRAFs should be small enough so that they do not print onto an exposed resist layer. For example, the SRAFs 204 should be sized small enough such that the SRAFs 204 patterned on the mask 202 are not transferred (i.e., printed) onto a resist-coated substrate during a lithographic exposure/development process. However, those of skill in the art will understand that larger sized SRAFs are desirable as they are known to provide a better DoF, contrast, and thus process window than their smaller sized counterparts. Thus, there is a trade-off between trying to size SRAFs small enough so that they do not print, yet large enough so as to yield the best DoF, contrast, and process window for a given lithographic process. Moreover, in at least some conventional processes, the use of mask layouts including SRAFs may result in inadvertently printed SRAFs onto a substrate.

Figure 3A:
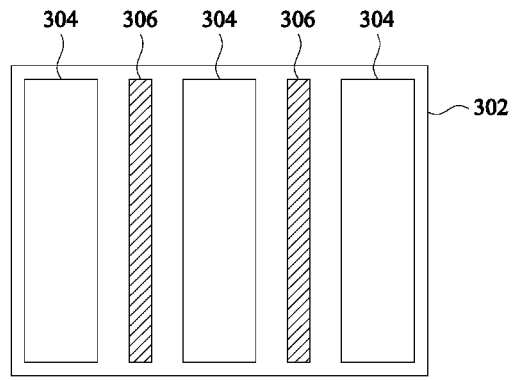
FIG. 3A illustrates a mask having a main feature and smaller sized SRAFs.
Figure 3B:
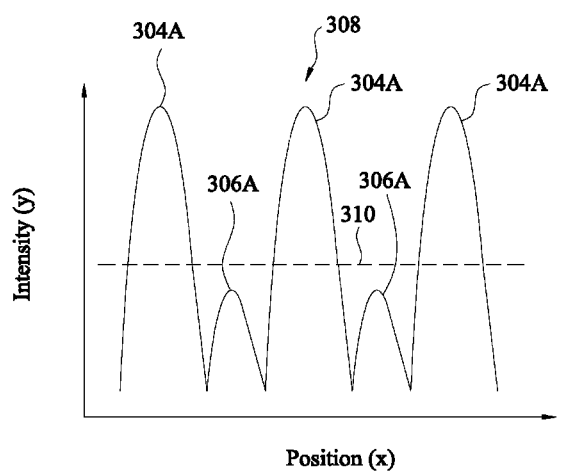
FIG. 3B illustrates an aerial image corresponding to the mask of FIG. 3A.
Figure 3C:
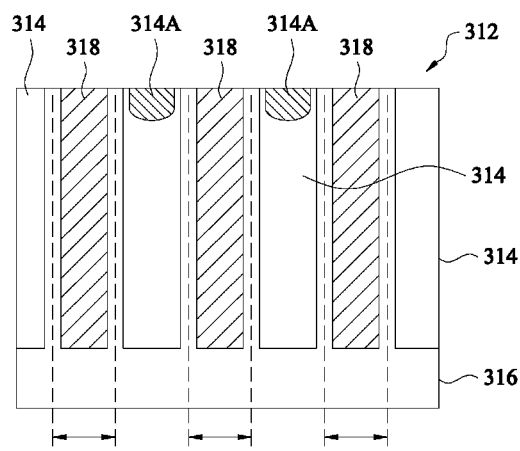
FIG. 3C illustrates a cross-section of a resist layer including a latent image formed by exposure through the mask of FIG. 3A.
Figure 4A:
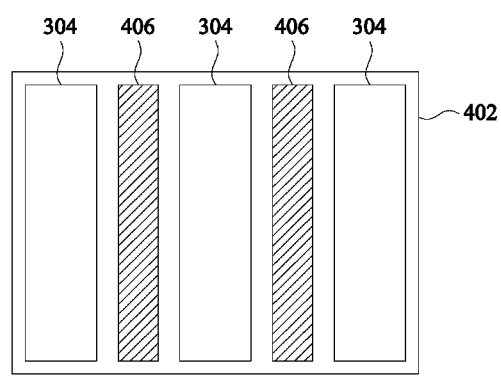
FIG. 4A illustrates a mask having a main feature and larger sized SRAFs.
Figure 4B:
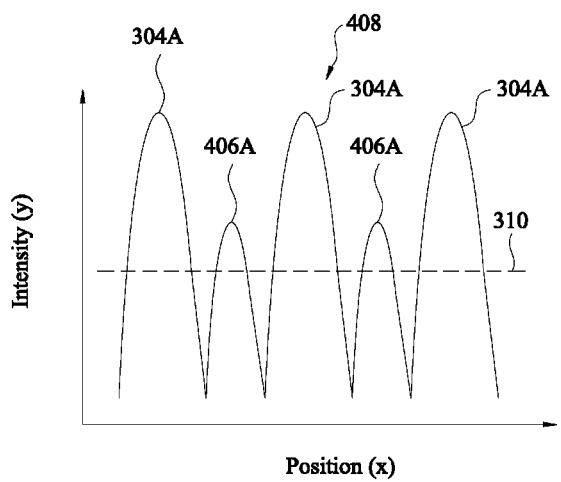
FIG. 4B illustrates an aerial image corresponding to the mask of FIG. 4A.
Figure 4C:
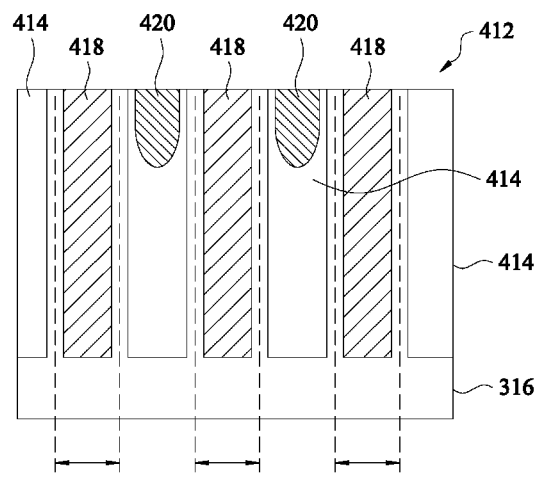
FIG. 4C illustrates a cross-section of a resist layer including a latent image formed by exposure through the mask of FIG. 4A.

By way of example, FIGS. 3A-3C (smaller sized SRAFs) and FIGS. 4A-4C (larger sized SRAFs) are used to illustrate this phenomenon. In some examples, the term "smaller sized SRAFs" may be used to describe SRAFs that generally will not print out (i.e., transfer) to a resist layer (e.g., during an exposure/development process). Similarly, the term "larger sized SRAFs" may be used to describe SRAFs that may print out, for example when using at least some conventional processing methods known in the art. In some embodiments, larger sized SRAFs have a larger width 'W' than smaller sized SRAFs. In some examples, larger sized SRAFs have a smaller spacing 'S' (e.g., to an adjacent main feature) than smaller sized SRAFs.

FIG. 3A shows an example of a mask 302 having a layout including main features 304 and smaller sized SRAFs 306. As described above with respect to main feature 104, main features 304 may be a portion of an IC design layout and may include various geometrical patterns designed for the fabrication of an IC device. FIG. 3B illustrates an aerial image 308 corresponding to the mask 302. The term "aerial image", as used herein, is used to describe a distribution of light intensity, at an image plane (e.g., at or near a resist surface), and as a function of spatial position. By way of example, the aerial image 308 may be generated by way of illumination of a resist-coated substrate (e.g., by a lithographic imaging system) through an intervening mask (e.g., the mask 302). As shown in FIG. 3B, the aerial image 308 includes a plurality of peaks 304A, corresponding to the main features 304, and a plurality of peaks 306A, corresponding to the smaller sized SRAFs 306. A threshold intensity 310 is also shown, where features with an intensity greater than the threshold intensity 310 (e.g., peaks 304A corresponding to the main features 304) may print (e.g., onto a resist-coated substrate), while features with an intensity less than the threshold intensity 310 (e.g., peaks 306A corresponding to the smaller sized SRAFs 306) may not print. The aerial image 308, through a lithographic exposure process, transfers its information (i.e., the information of the features of the mask 302) into a latent image 312. As used herein, a "latent image" is used to describe a spatial distribution of exposed and unexposed regions of resist.

For example, FIG. 3C illustrates a cross-section of a resist layer formed over a substrate 316 (e.g., by spin-coating the resist layer onto the substrate 316), where the resist layer has been exposed through the mask 302, resulting in the latent image 312 which includes unexposed regions of resist 314 and exposed regions of resist 318, which will print upon subsequent pattern development. In some embodiments, surface regions 314A of the unexposed regions of resist 314 may be partially exposed; however, as described above with reference to FIG. 3B, partial exposure of the surface regions 314A is below the threshold intensity 310 (peaks 306A), and as such the smaller sized SRAFs 306 will not print upon pattern development. Thus, performing a developing process after formation of the latent image 312 results in transfer (i.e., printing) of the patterns corresponding to the main features 304 to the resist layer on the substrate 316, while the patterns corresponding to the smaller sized SRAFs 306 do not transfer.

FIG. 4A shows an example of a mask 402 having a layout including the main features 304 and larger sized SRAFs 406. SRAFs 406 have a larger width 'W' than the smaller sized SRAFs 306, as well as a smaller spacing 'S' to the adjacent main features 304 than the smaller sized SRAFs 306. FIG. 4B illustrates an aerial image 408 corresponding to the mask 402. By way of example, the aerial image 408 may be generated by way of illumination of a resist-coated substrate (e.g., by a lithographic imaging system) through an intervening mask (e.g., the mask 402). As shown in FIG. 4B, the aerial image 408 includes the plurality of peaks 304A, corresponding to the main features 304, and a plurality of peaks 406A, corresponding to the larger sized SRAFs 406. The threshold intensity 310 is also shown. As in the example of FIG. 3B, the main features 304 will print, as the peaks 304A corresponding to the main features 304 have an intensity greater than the threshold intensity 310. However, as shown in FIG. 4B, the larger sized SRAFs 406 may also print, as the peaks 406A corresponding to the larger SRAFs 406 also have an intensity that is greater than the threshold intensity 310. The aerial image 408, through a lithographic exposure process, transfers its information (i.e., the information of the features of the mask 402) into a latent image 412.

For example, FIG. 4C illustrates a cross-section of a resist layer formed over the substrate 316 (e.g., by spin-coating the resist layer onto the substrate 316), where the resist layer has been exposed through the mask 402, resulting in the latent image 412 which includes unexposed regions of resist 414 and exposed regions of resist 418 corresponding to the main features 304, which will print upon subsequent pattern development. In some embodiments, regions of resist 420, corresponding to the larger SRAFs 406, are also exposed and may also print upon subsequent pattern development. Exposure of the regions 420, and subsequent pattern transfer, is expected due to the peaks 406A having an intensity greater than the threshold intensity 310. Thus, performing a developing process after formation of the latent image 412 results in transfer (i.e., printing) of the patterns corresponding to the main features 304 to the resist layer on the substrate 316, as well as transfer of the patterns corresponding to the larger sized SRAFs 406. While the exposed regions 420, corresponding to the larger sized SRAFs 406, are illustrated as exposing less than the entire thickness of the resist layer, exposure of regions 420 may be enough to form voids, gaps, and/or other undesirable features printed into the resist layer. In various embodiments, such undesirable features may lead to degraded pattern transfer to an underlying substrate and ultimately may lead to degraded device and/or circuit patterning and electrical performance.

Embodiments of the present disclosure offer advantages over the existing art, though it is understood that other embodiments may offer different advantages, not all advantages are necessarily discussed herein, and no particular advantage is required for all embodiments. For example, embodiments discussed herein include material compositions and methods for inhibiting the printing of SRAFs onto a substrate. For example, embodiments disclosed herein include mitigating the transfer of an SRAF pattern from a mask to a resist-coated substrate after an exposure/development process by one of more of the embodiments discussed below. By way of example, embodiments of the present disclosure provide an assist feature erase material (AFEM) composition. In some embodiments, the AFEM composition is deposited onto a patterned resist layer, where the patterned resist layer may include one or more inadvertently printed SRAF patterns, and where the AFEM composition is used to fill such inadvertently printed SRAF patterns. In accordance with various embodiments, the AFEM composition may be used to effectively "erase" the undesirable printed SRAFs within the resist layer, thereby mitigating potentially detrimental effects of such printed SRAFs within a resist layer. In some examples, the AFEM composition is deposited onto the patterned resist layer and fills voids, gaps, and/or other undesirable SRAF patterns which have been printed onto the resist layer. In various embodiments, the AFEM composition and related methods described herein serve to recover DoF, contrast, and process window that would otherwise have been lost due to the undesirable SRAFs printed within the resist layer.

It is noted that the material compositions and methods described herein may be applied to IC designs including SRAFs, where an SRAF generally includes non-printing scattering bars, serifs, and/or hammerheads that are added to an IC design layout according to optical models or rules such that, after a lithography process, a final pattern on a wafer is improved with enhanced resolution and precision. One of ordinary skill in the art in possession of this disclosure will appreciate that the material compositions and methods described herein may be applicable to IC designs including any of a variety of types of optical proximity correction (OPC) features, besides SRAFs, which should not be printed onto a substrate without departing from the scope of the present disclosure. In some embodiments, such SRAFs or other OPC features, which should not be printed to (e.g., transferred to) a resist layer and/or substrate, may be referred to generally as OPC resist artifact features. Moreover, other embodiments and advantages will be evident to those skilled in the art upon reading the present disclosure.

In addition, it is noted that the material compositions and methods of the present disclosure are not limited to a particular substrate type, mask type, resist type, radiation source (e.g., radiation wavelength), and/or lithography system type. For example, the material compositions and methods may be applied to features and/or devices patterned on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of resist such as poly (methyl methacrylate) (PMMA), SU-8, an EUV resist, a positive-tone resist, a negative-tone resist, or other types of resist as known in the art. Additionally, embodiments of the present disclosure are applicable to various lithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

Figure 5:
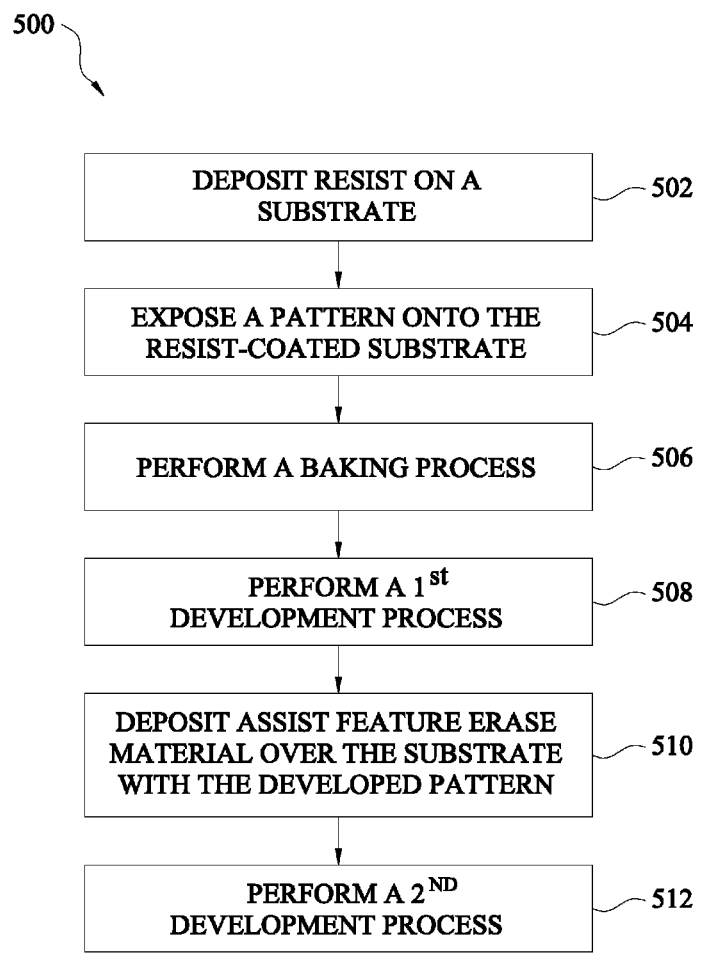
FIG. 5 shows a flowchart of a method 500 for inhibiting the printing of SRAFs onto a substrate, according to various embodiments.
Figure 6:
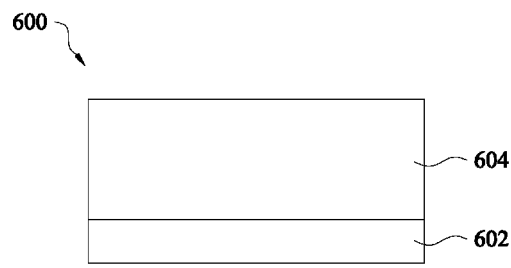
FIG. 6 illustrates a cross-section view of a device after deposition of a resist layer, in accordance with some embodiments.
Figure 7:
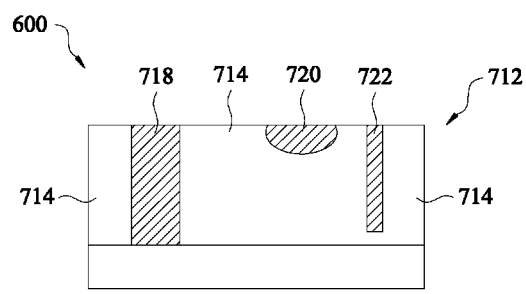
FIG. 7 illustrates a cross-section view of a device after exposure of the resist layer through an intervening mask, in accordance with some embodiments.

Referring now to FIG. 5, illustrated therein is a flow chart of a method 500 for inhibiting the printing of SRAFs onto a substrate, according to various embodiments. It is understood that additional operations can be provided before, during, and after the method 500, and some operations described can be replaced, eliminated, or moved around for additional embodiments of the method. It is also noted that the method 500 is exemplary, and is not intended to limit the present disclosure beyond what is explicitly recited in the claims that follow. The method 500 will be further described below in conjunction with FIGS. 6-10.

The method 500 begins at block 502 where a resist is deposited on a substrate. With reference to the example of FIG. 6, in an embodiment of block 502, illustrated therein is a cross-section view of a device 600 including a substrate 602. In some embodiments, the substrate 602 may include a semiconductor substrate, as described above, and the substrate 602 may include various layers, including conductive or insulating layers formed on the substrate 602, an organic layer, and/or various enhancement features, as previously described. The substrate 602 may also include various doping configurations depending on design requirements as is known in the art. In various embodiments, a photoresist layer (resist) 604 is formed over the substrate 602, for example by a spin-coating process. In some examples, prior to forming the resist layer 604, an adhesion layer (e.g., such as an HMDS layer) is formed over the substrate 602. In some embodiments, after formation of the resist layer 604, and prior to performing an exposure process, a pre-bake process may be performed to evaporate solvents and to densify the resist layer 604.

The method 500 proceeds to block 504 where a pattern is exposed onto the resist-coated substrate. With reference to the example of FIG. 7, in an embodiment of block 504, illustrated therein is a cross-section view of the device 600, where the resist layer 604 (FIG. 6) has been exposed (e.g., by a lithographic imaging system) through an intervening mask (e.g., such as the mask 402) having at least one main feature and one or more larger SRAFs adjacent to the main feature. As discussed above, "larger SRAFs" on the intervening mask used to expose the resist layer 604 may result in aerial image intensities greater than a threshold level, resulting in printing of the SRAFs. With reference to the example of FIG. 7, the pattern exposure process results in a latent image 712 which includes unexposed regions of resist 714, an exposed region of resist 718 corresponding to a main feature, and exposed regions of resist 720, 722 corresponding to the larger SRAFs. Thus, following a subsequent development process, described below, both the desired exposed region 718 and undesired exposed regions 720, 722 may print (e.g., be transferred to the resist layer).

The method 500 proceeds to block 506 where a baking process is performed. For example, in some embodiments, after exposure of the resist layer 604 (FIG. 6) and formation of the latent image 712 (FIG. 7), and prior to performing a resist development process, a post-bake process may be performed to stabilize and harden the developed resist layer. In some examples, the post-bake process may also serve to remove remaining traces of solvent.

Figure 8:
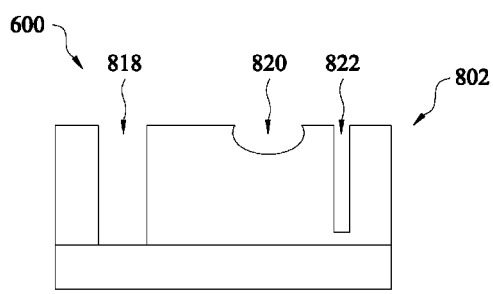
FIG. 8 illustrates a cross-section view of a device after a resist development process, in accordance with some embodiments.

The method 500 proceeds to block 508 where a first development process is performed. With reference to the example of FIGS. 7 and 8, in an embodiment of block 508, after formation of the latent image 712 by exposure through the intervening mask (e.g., such as the mask 402), a resist development process is performed, resulting in a patterned resist layer 802. In some embodiments, the resist development process includes a wet chemical development process, as known in the art. By way of example, if a positive-tone resist has been used, the resist development process dissolves the exposed regions of resist 718, 720, 722. In some cases, if a negative-tone resist has been used, exposed regions of resist 718, 720, 722 become insoluble and the resist development process dissolves the unexposed regions of resist 714. For purposes of discussion of the examples of FIGS. 6-10, use of a positive-tone resist is illustrated. With reference to FIG. 8, and as a result of the resist development process, a main feature 818 corresponding to the exposed region of resist 718, and SRAFs 820, 822 corresponding to the exposed regions of resist 720, 722 are formed (e.g., printed) within the resist layer 604, resulting in the patterned resist layer 802. Thus, following the first development process of block 508, both the desired main feature 818 and undesired SRAFs 820, 822 are printed to (e.g., transferred to) the resist layer 604. Also, as described above with respect to main feature 104 and main features 304, the main feature 818 may be a portion of an IC design layout and may include various geometrical patterns designed for the fabrication of an IC device.

Figure 9:
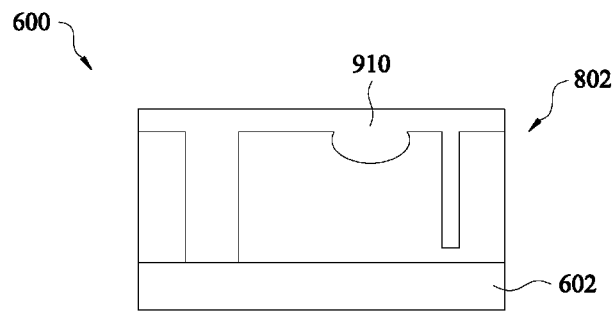
FIG. 9 illustrates a cross-section view of a device after deposition of an assist feature erase material (AFEM) composition, in accordance with some embodiments.

The method 500 then proceeds to block 510 where an assist feature erase material (AFEM) composition is deposited. With reference to the example of FIGS. 8 and 9, in an embodiment of block 510, an AFEM composition 910 is deposited over the patterned resist layer 802 on the substrate 602. In various embodiments, the AFEM composition 910 may be deposited over the patterned resist layer 802, for example by a spin-coating process. However, in some embodiments, the AFEM composition 910 may be deposited by an alternative method (e.g., ALD, CVD, or other method), for example depending on a type of material used for the AFEM composition 910. Details of various materials used for the AFEM composition 910 are discussed in more detail below with respect to FIGS. 11A-11C, 12A/12B, 13A/13B, and 14-16. In various embodiments, deposition of the AFEM composition 910 (regardless of the method of deposition used) fills each of the openings in the patterned resist layer 802 defined by the main feature 818 and the SRAFs 820, 822. While deposition of the AFEM composition 910 is illustrated in FIG. 9 as resulting in the AFEM composition 910 having a substantially planar top surface, in some embodiments, deposition of the AFEM composition 910 may be more conformal. For example, in some cases, the deposited AFEM composition 910 may conform at least partially to a surface profile of the device 600 (e.g., including the patterned resist layer 802 and the exposed substrate 602).

In the embodiments disclosed herein, the type of material(s) used for the AFEM composition 910 is chosen such that the AFEM composition 910 reacts with (e.g., bonds to) a photoresist (resist) material, while not reacting with (e.g., not bonding to) other exposed material surfaces (e.g., non-resist surfaces) such as an underlying semiconductor layer, metal layer, or other type of non-photoresist layer. Thus, for example with reference to FIG. 9, the deposited AFEM composition 910 reacts with (e.g., bonds to) portions of the patterned resist layer 802 that come into direct contact with the AFEM composition 910. Stated another way, the AFEM composition 910 forms a bond with exposed resist surfaces of the patterned resist layer 802, for example, by way of a cross-linking process, by Coulomb forces, by van der Waals forces, by polymer entanglement (e.g., intermixing), H-bonding, dipole absorption, or by other ionic, electrostatic, and/or non-covalent interactions. Additional details of various bonding/reaction mechanisms between a resist material and the AFEM composition 910 are discussed in more detail below in conjunction with the discussion of the materials used for the AFEM composition 910. In various embodiments, reaction of the resist material of the patterned resist layer 802 with the AFEM composition 910 serves to form a layer on exposed surfaces of the patterned resist layer 802 and fill in each of the openings in the patterned resist layer 802 defined by the main feature 818 and the SRAFs 820, 822, as described above.

The method 500 proceeds to block 512 where a second development process is performed. With reference to the example of FIGS. 9 and 10, in an embodiment of block 512, after deposition of the AFEM composition 910 over the patterned resist layer 802 (and reaction of the AFEM composition 910 to exposed resist surfaces of the patterned resist layer 802), a second development process is performed, resulting in a patterned AFEM composition layer 910A. In some embodiments, the second development process includes a wet chemical development process, as known in the art. In some examples, a developer used for the second development process is the same as the developer used for the first development process. In some cases, the developer used for the second development process is different than the developer used for the first development process. Regardless of the type of developer used for the second development process, in some embodiments, the patterned resist layer 802 remains protected by the AFEM composition 910 during the second development process. By way of example, the second development process dissolves portions of the AFEM composition 910 that are not in contact with (and thus have not reacted with/bonded to) the resist of the patterned resist layer 802.

Figure 10:
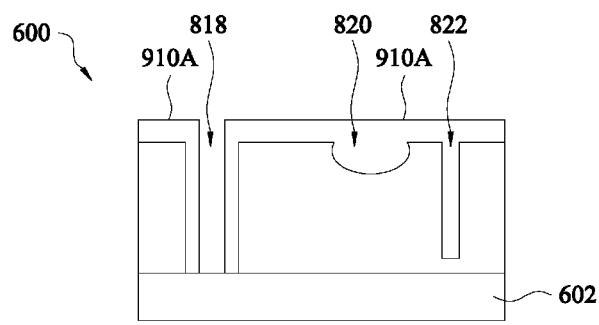
FIG. 10 illustrates a cross-section view of a device after an AFEM composition development process, in accordance with some embodiments.

With reference to FIG. 10, and after the second development process, sidewalls of the main feature 818 remain coated with the AFEM composition 910, while the underlying substrate 602 is exposed in the region defined by the main feature 818. In addition, after the second development process, the undesirable SRAFs 820, 822 remain filled with the AFEM composition 910. Thus, following the second development process of block 512, the desired main feature 818 remains printed to (e.g., transferred to) the resist layer 604, while the undesired SRAFs 820, 822 are effectively "erased", thereby mitigating potentially detrimental effects of such printed SRAFs within the resist layer 604. For purposes of illustration, if an etching process is performed after the second development process (e.g., to etch the underlying substrate 602 in the region defined by the main feature 818), the AFEM composition 910 may not react with the etchant (e.g., wet etchant or dry gas etchant) or may otherwise suppress and/or resist the etching process. Thus, such an etching process may etch in desired regions (e.g., etching the underlying substrate 602 in the region defined by the main feature 818), while not etching in other regions protected by the AFEM composition 910, and thereby preserving the desired pattern (e.g., corresponding to a designed mask pattern).

It is noted that in some embodiments a width of the main feature 818 may be reduced after the second development process due to the sidewalls of the main feature 818 being coated with the AFEM composition 910, which might in some cases affect subsequent processing steps. Thus, in some embodiments, the width of the main feature 818 may be designed (e.g., during an IC layout design process) to have a larger initial width to account for such possible width reduction resulting from the sidewall coating by the AFEM composition 910. While FIGS. 6-10 have been used to describe some embodiments, the AFEM composition 910 and related methods may be used in any of a variety of methods and on any of a variety of resist types. Generally, in various embodiments, the AFEM composition 910 may be deposited onto a patterned resist layer to fill voids, gaps, trenches, and/or other undesirable SRAF patterns which have been printed onto a resist layer. In so doing, the AFEM composition and related methods described herein serve to recover DoF, contrast, and process window that would otherwise have been lost due to the undesirable SRAFs printed within the resist layer.

Figure 11A:
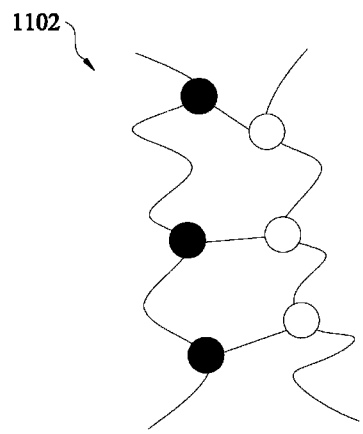
FIGS. 11A-11C illustrate bond types formed between the AFEM composition and a resist material, according to some embodiments.
Figure 11B:
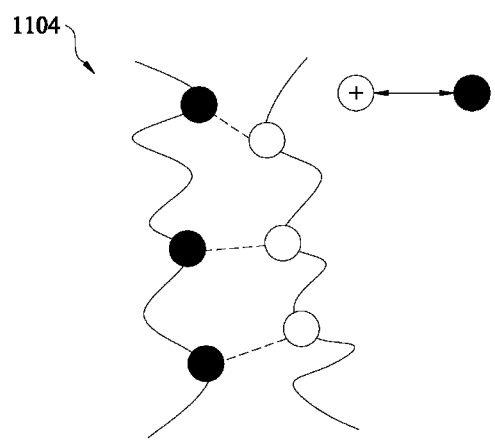
Figure 11C:
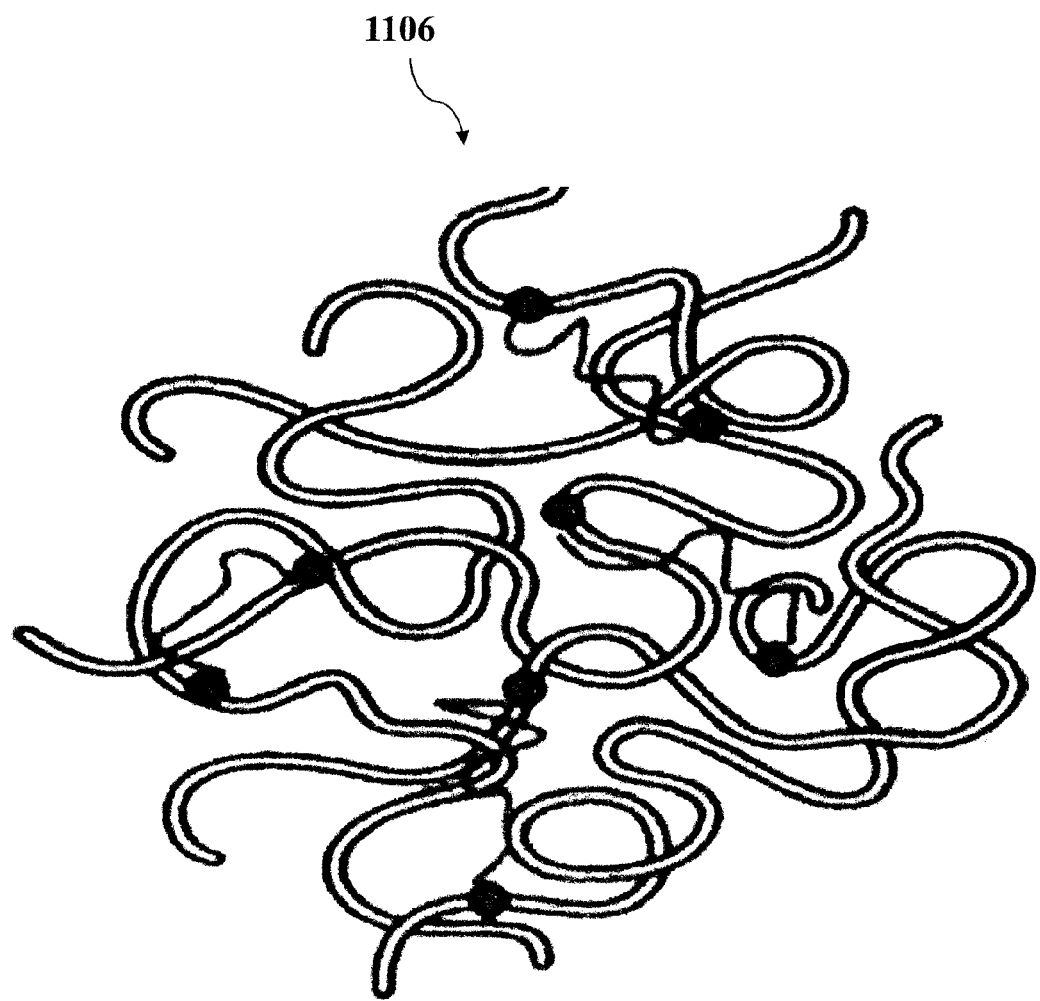

Referring now to FIGS. 11A-11C, illustrated therein are some embodiments of bond types that may be formed between the AFEM composition 910 and a resist material. For example, FIG. 11A illustrates a cross-linking bond 1102 between the AFEM composition 910 and a resist material, FIG. 11B illustrates a Coulomb force bond 1104 (e.g., or other non-covalent interaction) between the AFEM composition 910 and a resist material, and FIG. 11C illustrates a polymer entanglement bond 1106 between the AFEM composition 910 and a resist material.

Figures 12A, 12B:
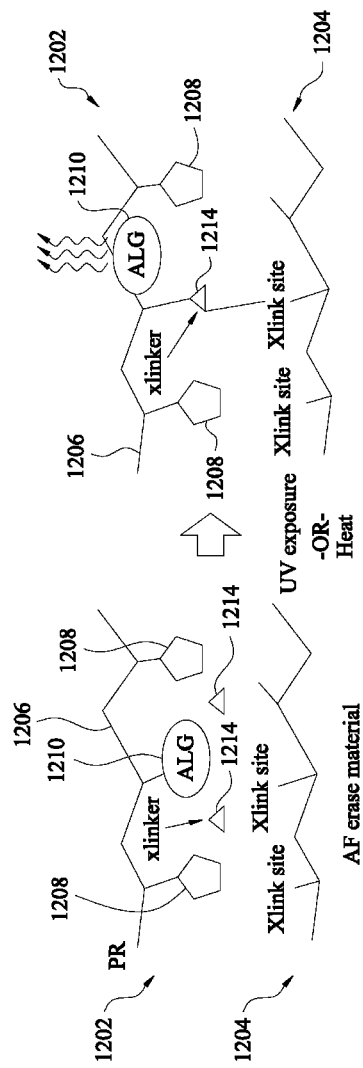
FIGS. 12A/12B illustrate a more detailed view of formation of a cross-linking bond, as well as a more detailed view of materials used to form the cross-linking bond, according to some embodiments.

With reference to FIGS. 12A/12B, illustrated therein is a more detailed view of the formation of the cross-linking bond 1102, as well as a more detailed view of at least some of the constituent materials to form the cross-linking bond 1102. In particular, FIG. 12A schematically shows a resist polymer structure 1202 adjacent to an AFEM composition polymer structure 1204. In some embodiments, the resist polymer structure 1202 includes a polymer backbone 1206, organic compounds 1208, and an (acid labile group) ALG 1210. In some examples, the AFEM composition polymer structure 1204 includes a plurality of cross-linking sites, labeled as 'Xlink site' in FIG. 12A. In some embodiments, one or more cross-linkers 1214 assist in forming a new chemical bond between the resist polymer structure 1202 and AFEM composition polymer structure 1204. In some embodiments, the cross-linker 1214 may be part of the AFEM composition 910 and thus may be deposited together with the AFEM composition 910. In some examples, the cross-linker 1214 may be a separately deposited material (e.g., separately deposited on a resist layer prior to deposition of the AFEM composition 910). In some cases, the cross-linker 1214 may be part of the resist layer. In various embodiments, the Xlink site of the AFEM composition polymer structure 1204 may include a functional group such as OH, epoxy, $RNH_2$, $R_2NH$, SH, COOH, OH, $NH_2$, or other functional group as known in the art.

By way of example, as a result of providing a reaction catalyst such as exposure to a UV light source or applied heat, the ALG 1210 may be removed (e.g., from the polymer backbone 1206), and a cross-linker 1214 may then occupy (e.g., bond to) the bond site previously occupied by the ALD 1210, as shown in FIG. 12B. Additionally, a functional group from a Xlink site of the AFEM composition polymer structure 1204 may also bond to the cross-linker 1214 (which is now bonded to the polymer backbone 1206), thereby completing a cross-linking bond between the resist polymer structure 1202 and AFEM composition polymer structure 1204. In some embodiments, depending for example on specific materials used, a coupling reagent may also be employed to assist in the bond formation of disparate materials (e.g., a resist material and the AFEM composition 910).

Figure 13B:
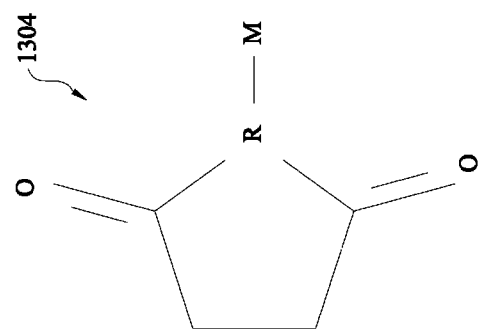
FIG. 13B illustrates an exemplary chemical structure of a coupling reagent, according to some embodiments.
Figure 13A:
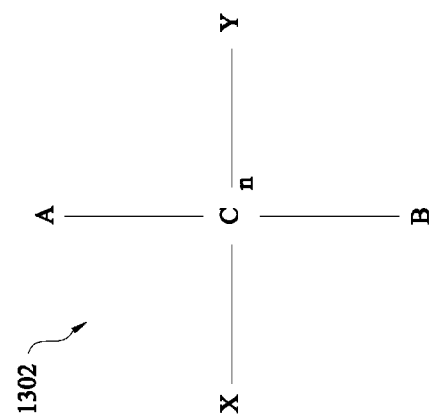
FIG. 13A illustrates an exemplary chemical structure of a cross-linker, according to some embodiments.

Expanding upon the structure of the cross-linker 1214, and with reference to FIG. 13A, an embodiment of a compound used as the cross-linker 1214 is illustrated. In particular, FIG. 13A illustrates a chemical structure 1302 including a carbon cluster 'Cn', where in some embodiments n has a value within the range of about 1-15. In some examples, the chemical structure 1302 further includes compounds 'A' and 'B', which may include H, OH, a halide, an aromatic carbon ring, or a straight or cyclic alkyl, alkoxyl, fluoro alkyl, or fluoroalkoxyl chain having a carbon chain with a number of carbon atoms from about 1-12. In some embodiments, the chemical structure 1302 also includes compounds 'X' and 'Y', which may include $-NH_2$, $-SH$, $-OH$, isopropyl alcohol, isopropyl amine, or thiol.

Expanding upon the structure of the optional coupling reagent, and with reference to FIG. 13B, an embodiment of a compound used as the coupling reagent is illustrated. In particular, FIG. 13B illustrates a chemical structure 1304 including a compound 'R', which may include C, N, S, or O. In various embodiments, the compound 'R' is bonded to a compound 'M', where 'M' may include $-Cl$, $-Br$, $-I$, $-NO_2$, $-SO_3^-$, $-H^-$, $-CN$, $-NCO$, $-OCN$, $-CO_2^-$, $-OH$, $-OR^*$, $-OC(O)CR^*$, $-SR$, $-SO_2N(R^*)_2$, $-SO_2R^*$, SOR, $-OC(O)R^*$, $-C(O)OR^*$, $-C(O)R^*$, $-Si(OR^*)_3$, $-Si(R^*)_3$, and/or one or more epoxyl groups.

Figure 14:
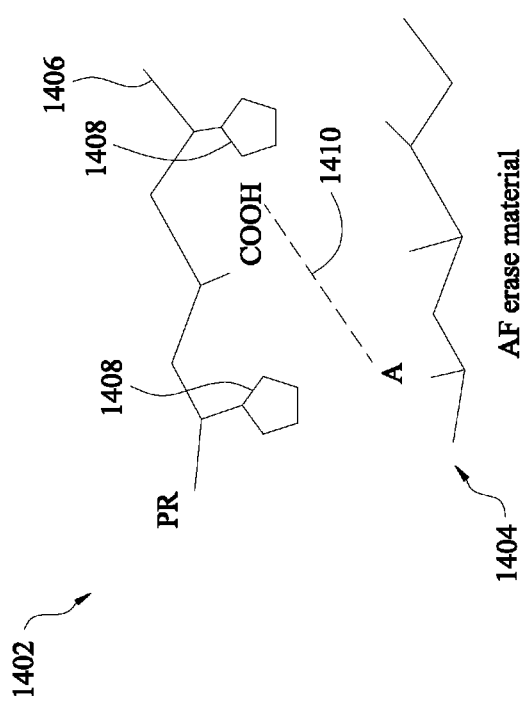
FIG. 14 illustrates a more detailed view of formation of a non-covalent bond, as well as a more detailed view of materials used to form the non-covalent bond, according to some embodiments.

With reference to FIG. 14, illustrated therein is a more detailed view of the formation of the Coulomb force bond 1104 (e.g., or other non-covalent bond), as well as a more detailed view of at least some of the constituent materials to form the Coulomb force bond 1104. In particular, FIG. 14 schematically shows a resist polymer structure 1402 adjacent to an AFEM composition polymer structure 1404. In some embodiments, the resist polymer structure 1402 includes a polymer backbone 1406, organic compounds 1408, and an anionic carboxyl (COOH, $COO^-$). In some examples, the AFEM composition polymer structure 1404 includes one or more electronegative elements/compounds labeled as 'A' in FIG. 14. In some embodiments, 'A' may include OH, $RNH_2$, SH, $R_2NH$, F, $CF_3$, Na, and/or other electronegative elements or compounds, which may include cations such as $H^+$, $NH_3^+$, $Na^+$, etc. In various embodiments, as illustrated by dashed line 1410, the anionic carboxyl and the cationic electronegative element/compound 'A' may form a non-covalent bond, for example in respond to Coulomb forces, van der Waal's forces, or other ionic forces.

Figure 15:
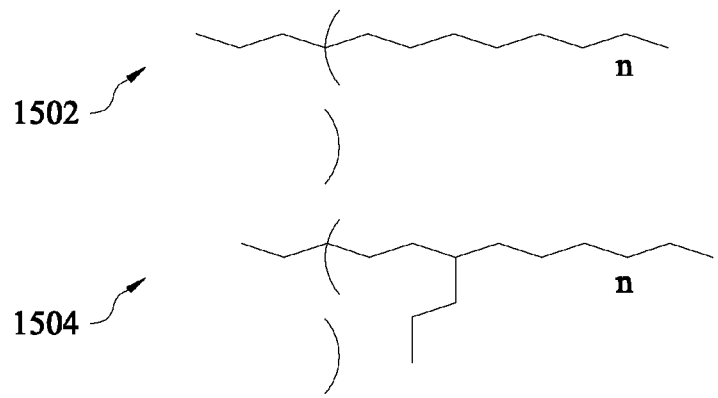
FIGS. 15 and 16 illustrate more detailed views of at least some polymers which may be used to form the AFEM composition, and which in turn may be used to form a polymer entanglement bond, in accordance with some embodiments.
Figure 16:
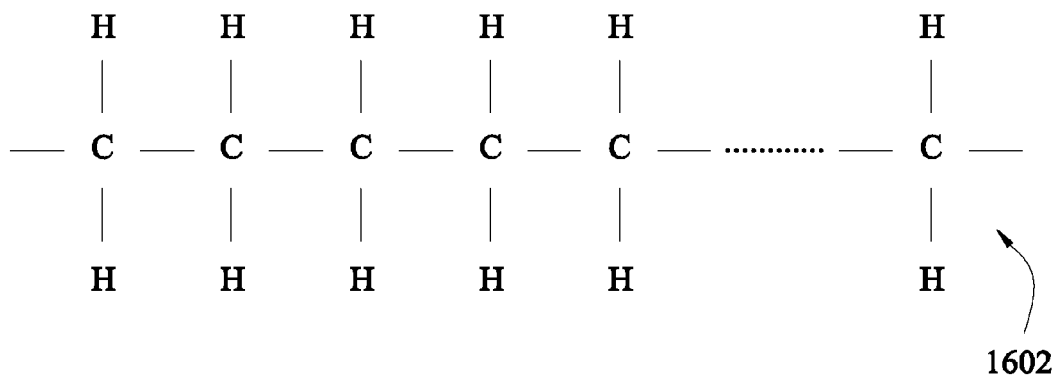

With reference to FIGS. 15 and 16, illustrated therein is a more detailed view of at least some polymers which may be used to form the AFEM composition 910, and which in turn may be used to form the polymer entanglement bond 1106 with a resist surface. In particular, FIG. 15 shows examples of alkyl chains 1502, 1504 which may be used to form the AFEM composition 910, and FIG. 16 shows an example of linear or branch type polymer 1602 which may be used to form the AFEM composition 910. In some embodiments, the illustrative polymers of FIGS. 15/16 include a flexible polymer backbone, may have a high molecular weight (e.g., MW in a range of about 3000-30,000), as well as a low glass transition temperature (Tg) and low melting point. In various embodiments, the illustrative polymers of FIGS. 15/16 used to form the AFEM composition 910 may readily adhere to a resist surface.

Figure 17:
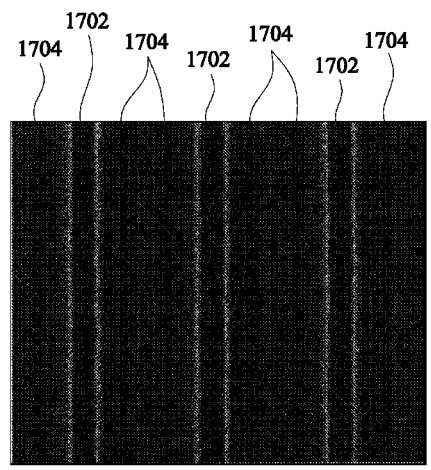
FIGS. 17 and 18 illustrate scanning electron microscope (SEM) images of resist-coated substrates patterned according to at least some conventional methods and patterned according to the method 500 of FIG. 5, in accordance with some embodiments.
Figure 18:
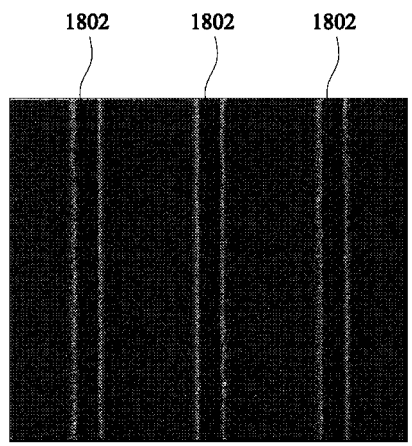

Referring now to FIGS. 17 and 18, illustrated therein are scanning electron microscope (SEM) images of resist-coated substrates patterned according to at least some conventional methods (FIG. 17) and patterned according to the method 500 described above (FIG. 18), showing an example of the advantages afforded by the present disclosure. FIG. 17, having a pattern formed according to at least some conventional methods, shows a patterned resist layer including patterned main features 1702 (e.g., similar to patterned main feature 818 discussed above) as well as SRAFs 1704 (e.g., similar to SRAFs 820, 822) which have been patterned into the resist layer. For the example of FIG. 17, the DoF is about 75. In contrast, FIG. 18, having a pattern formed according to the method 500, shows a patterned resist layer including patterned main features 1802 (e.g., similar to patterned main feature 818). However, SRAFs are not patterned into the resist layer of FIG. 18, thereby preserving the desired pattern (e.g., corresponding to a designed mask pattern through which the resist of FIG. 18 was exposed). For the example of FIG. 18, the DoF is about 85. Thus, FIGS. 17 and 18 provide an illustrative example of how the AFEM composition and related methods described herein serve to recover DoF, as well as contrast and process window, which would otherwise have been lost due to the undesirable SRAFs printed within the resist layer.

Embodiments of the present disclosure may further include a method and for optical proximity correction (OPC) including data collection, model fitting, simulation, and print-out behavior prediction. In various embodiments, this allows assistant feature (AF) print out, side-lobe imaging, and imaging of other layer damage (e.g., undesirable printed features, as described above) under specific conditions, such as under certain widths, smaller than a certain area, shallower than certain depth, or a combination of such criteria. In some embodiments, such undesirable damage may be "erased" from the wafer, for example, immediately after a lithography process or in another process stage with proper non-lithography processes. Embodiments of the present disclosure may be applied to an EUV system, a maskless Electron Beam Direct Write (EBDW) system, as well as to the guide feature of a Directed Self-Assemble (DSA) pattern system.

As previously discussed, optical lithography assistant features, such as Sub-Resolution Assistant Features (SRAFs) and Full-Size Scattering Bars (FSSBs), help to enlarge the process window. For example, in various embodiments, such features help to increase an Image Log Slope (ILS), to enlarge the Depth of Focus (DoF), and to reduce the impact of the Optical Proximity Effect (OPE). However, the introduction of assistant features, according to conventional processes, may bring some drawbacks. For example, conventional assist feature solution may require complicated calculations, the generation of complex masks, and they may induce the potential risk of printing undesirable patterns on the wafer. Thus, the printing out of assist features is generally not allowed, in order to stay within a given process window, in accordance with at least some conventional methods. In other word, conventional methods generally focused on prevention of assist feature and side-lobe print-out. In contrast, some embodiments disclosed herein provide a method to predict damage (e.g., undesirable printing of assist features), for example by using a simulation model, where such modeled/predicted damage may be subsequently healed (e.g., "erased") using a non-lithographic process.

Merely by way of example, a method to implement one or more of the present embodiments may include building a model for imaging, getting a desired layout, predicting the behavior of a main pattern and pattern damage, applying OPC on the main pattern and inserting the SDAF into the original layout, fabricating a mask (e.g., for projection lithography) or transfer to direct write tool, applying an imaging process to a wafer or directly writing to a wafer, optionally transferring pattern from PR to a buffer layer, applying erosion process (e.g., such as etching process) to remove the line-type residue from the wafer, and transferring a final pattern to the target layer. In some embodiments, a dilation process may be applied, for example such as a spacer process to remove the trench-type damage from wafer.

Figure 19:
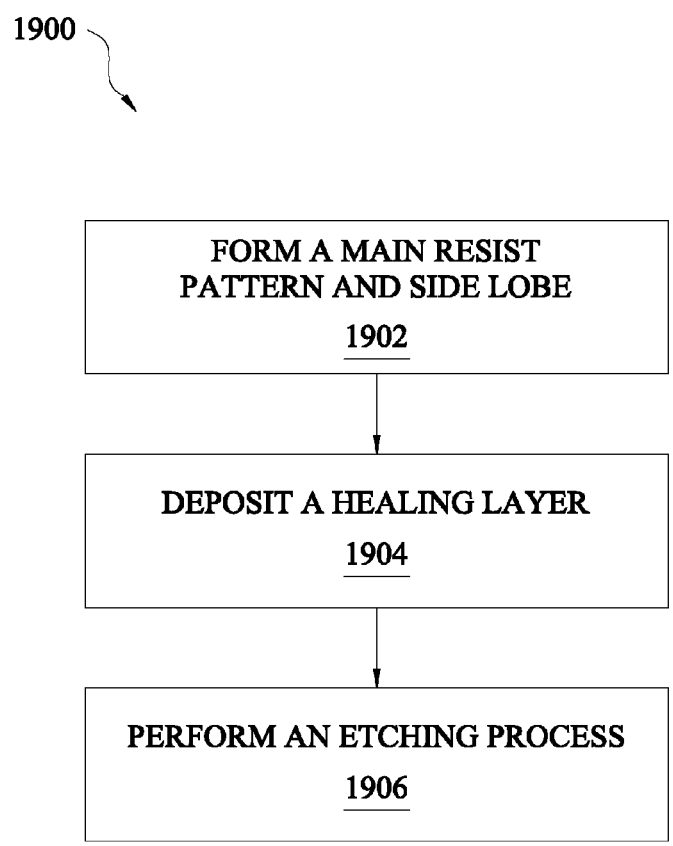
FIG. 19 shows a flowchart of a method 1900 for printing a main feature and side-lobe onto a substrate, followed by a healing process, according to various embodiments.
Figure 20:
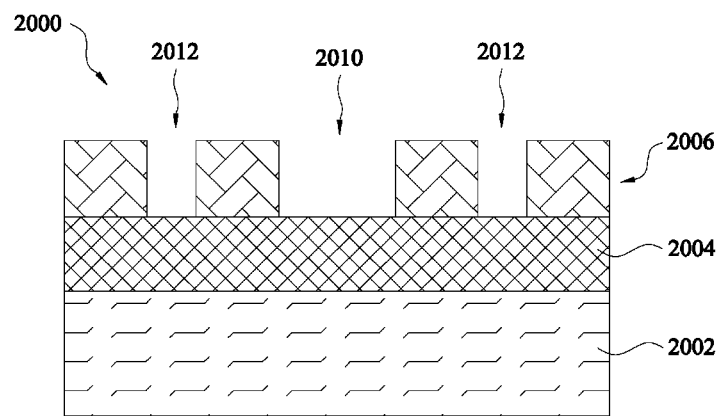
FIG. 20-26 illustrates cross-section views of a device in accordance with the method 1900 of FIG. 19.
Figure 21:
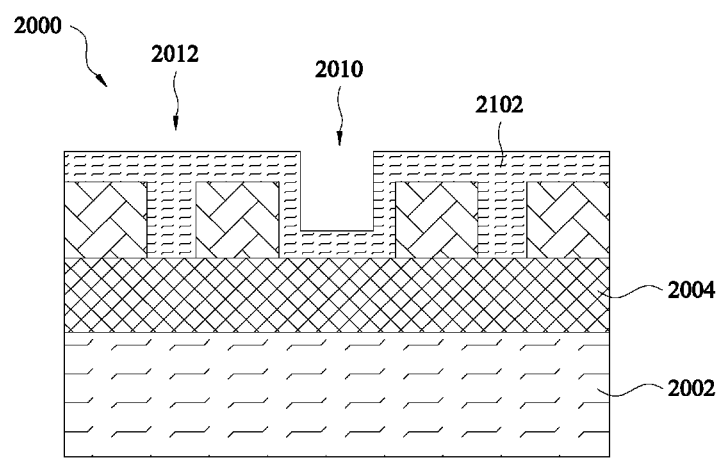

Referring now to FIG. 19, illustrated therein is a flow chart of a method 1900 for printing a main feature and side-lobe onto a substrate, followed by a healing process, according to various embodiments. It is understood that additional operations can be provided before, during, and after the method 1900, and some operations described can be replaced, eliminated, or moved around for additional embodiments of the method. It is also noted that the method 1900 is exemplary, and is not intended to limit the present disclosure beyond what is explicitly recited in the claims that follow. The method 1900 will be further described below in conjunction with FIGS. 20-26.

The method 1900 begins at block 1902 where a main resist pattern and a side lobe are patterned into a resist layer. With reference to the example of FIG. 20, in an embodiment of block 1902, illustrated therein is a cross-section view of a device 2000 including a substrate 2002, a target layer 2004, and a patterned resist layer 2006. In various embodiments, after a photolithography process (e.g., including resist deposition, exposure, baking, and developing processes), a main pattern 2010 may be formed, as well as a side lobe 2012 and/or scattering bar. As discussed above, embodiments disclosed herein provide a method to predict damage (e.g., printing of the side lobes 2012 and/or scattering bars), for example by using a simulation model, where such modeled/predicted damage may be subsequently healed (e.g., "erased") using a non-lithographic process, as discussed below.

The method 1900 proceeds to block 1904 where a healing layer is deposited. With reference to the example of FIG. 21, in an embodiment of block 1904, after formation of the main pattern 2010 and the side lobes 2012 and/or scattering bars, a healing layer 2102 is deposited over the device 2000. In some embodiments, the healing layer 2102 may include one or more materials, such as silicon oxide, silicon nitride, silicon oxynitride (SiON), and/or titanium nitride (TiN). In some embodiments, the healing layer 2102 has a thickness in a range from about 1 nm to about 15 nm. In some cases, the healing layer 2102 may be formed using one or more processes selected from the group consisting of CVD, PVD, ALD, spin-on method, sputtering, thermal oxidation, and a combination thereof. In some embodiments, the healing layer 2102 is conformally deposited over the device 2000.

Figure 22:
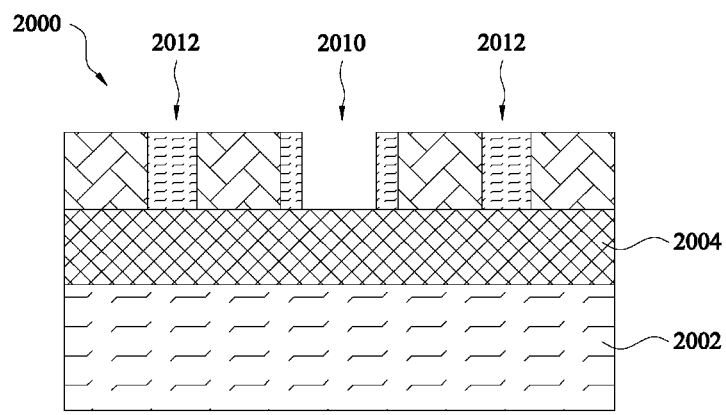

The method 1900 proceeds to block 1906 where an etching process is performed. With reference to the example of FIG. 22, in an embodiment of block 1906, an etching process is performed. In some embodiments, when the healing layer 2102 includes silicon oxide, silicon nitride, and/or silicon oxynitride (SiON), the etching process may include using an etching gas including at least one of carbon tetrafluoride (CF4), difluoromethane (CH2F2), trifluoromethane (CHF3), other suitable etching gases, or combinations thereof. In some embodiments, when the healing layer 2102 includes titanium nitride, the etching process may include using an etching gas including at least chlorine (Cl2) or any other suitable etching gases. In various embodiments, the etching process of block 1906 is controlled so as to open a trench at the main pattern 2010 but not at the side lobe 2102 and/or scattering bar. Thus, the side lobes 2102 and/or scattering bars, while they may have been purposely, are effectively "erased" as shown in FIG. 22, similar to the methods discussed above.

Figure 23:
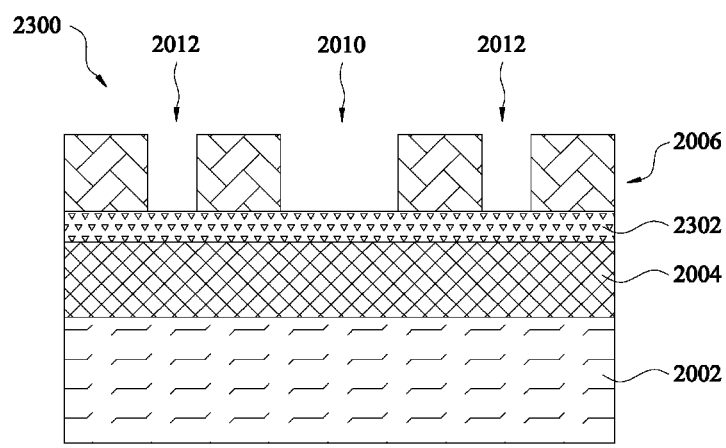
Figure 24:
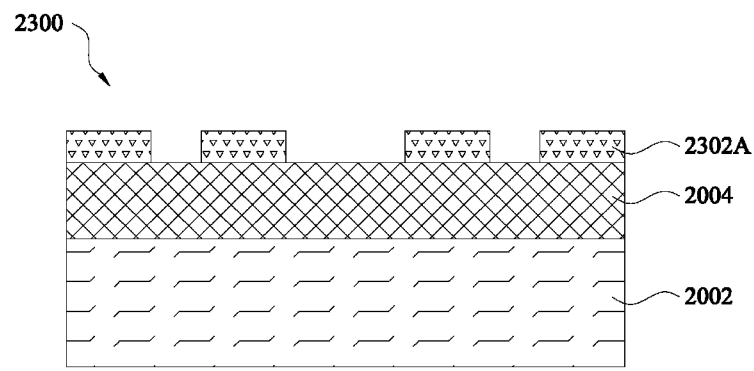

In some embodiments, a buffer layer may additionally be included between the target layer and the PR. For example, with reference to FIGS. 23-26, illustrated there in an embodiment of the method 1900 including a buffer layer. For example, with reference to the example of FIG. 23, illustrated therein is a cross-section view of a device 2300 including the substrate 2002, the target layer 2004, a buffer layer 2302, and the patterned resist layer 2006. As described above, after a photolithography process, the main pattern 2010 may be formed, as well as the side lobe 2012 and/or scattering bar. In some embodiments, the patterns of the patterned resist layer 2006 are transferred onto the buffer layer 2302, for example, by way of an etching process, as shown in FIG. 24. In addition, in some cases, the buffer layer 2302 includes a material similar to the healing layer 2102.

Figure 25:
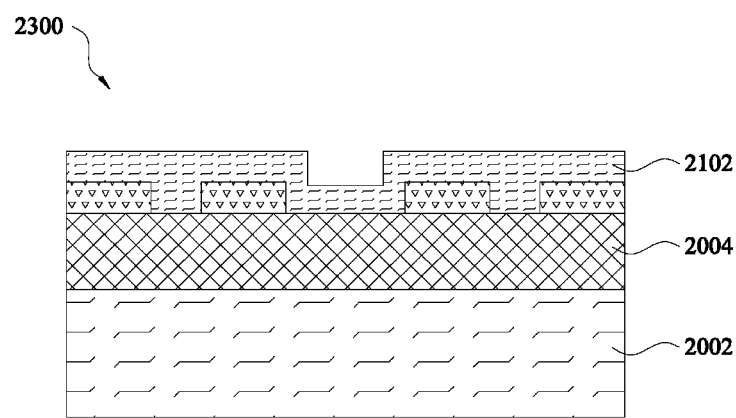

With reference to the example of FIG. 25, the healing layer 2102 is deposited over the device 2302. The healing layer 2102 may include the materials described above and may be deposited as described above. In some embodiments, the healing layer 2102 is conformally deposited over the device 2300.

Figure 26:
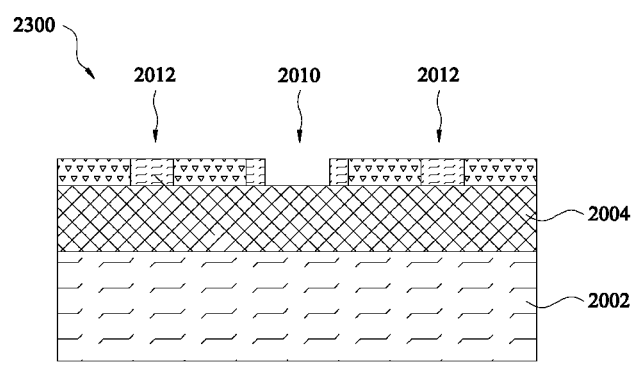

With reference to the example of FIG. 26, an etching process is performed. As described above, and in various embodiments, the etching process is controlled so as to open a trench at the main pattern 2010 but not at the side lobe 2102 and/or scattering bar. Thus, the side lobes 2102 and/or scattering bars, while they may have been purposely, are effectively "erased" as shown in FIG. 26, similar to the methods discussed above. In some embodiments, the pattern transferred to the buffer layer 2303 may subsequently transferred to the underlying target layer 2004.

Thus, as described above, various embodiments include patterning a workpiece, which may include building a imaging model for predicting the imaging process and pattern behavior, receiving a desired layout, modifying the desired layout and inserting an assistant feature into the desired layout, fabricating a mask containing the reshaped layout and the assistant feature, applying a lithographic imaging process to transfer the pattern from the mask onto the workpiece, and applying a non-lithography processes on the workpiece to remove undesirable features (e.g., side lobes and/or scattering bars) while keeping the desired layout (e.g., main feature). In addition, in some embodiments, the assistant feature has a smaller dimension than the desired layout on the workpiece. In some cases, one or more processes are added between the lithography imaging process and the non-lithography process for removal of the assistant feature. In some embodiments, the one or more added processes include an etching process to transfer the pattern from a resistant layer onto another substrate. In some cases, the non-lithography processes includes an etching process to reduce the dimension of imaged pattern. In some embodiments, the non-lithography processes include a film deposition process to increase the dimension of imaged pattern. Generally, key features of some embodiments include "model building for prediction of subsequent printing behavior" and "assistant feature generation" for subsequent removal by a non-lithography process.

In addition, additional embodiments may include a method of patterning a workpiece, the method including receiving a mask for patterning the workpiece, lithographically exposing the workpiece using the mask, and applying a non-lithography processes on the workpiece to remove at least one small object while keeping a desired layout. In some embodiments, the at least one small object has an area less than or equal to about 50% of a desired/target layout area. In some cases, the small object has a CD less than or equal to about 50% of a desired/target layout CD width. In various examples, embodiments disclosed herein may be applied to specific regions of a wafer, as well as to an entire wafer surface. In some embodiments, the one or more added processes include an etching process to transfer the pattern from a resistant layer onto another substrate. In some embodiments, the non-lithography processes includes an etching process to reduce the dimension of the imaged pattern. In some cases, the non-lithography processes include a film deposition process to increase the dimension of imaged pattern. Generally, key features of some embodiments include removal of the at least one small object by a non-lithography process.

The embodiments of the present disclosure offer advantages over existing art, though it is understood that other embodiments may offer different advantages, not all advantages are necessarily discussed herein, and that no particular advantage is required for all embodiments. For example, embodiments discussed herein include material compositions and methods for inhibiting the printing of SRAFs onto a substrate. For example, embodiments disclosed herein include inhibiting the transfer of an SRAF pattern from a mask to a resist-coated substrate after an exposure/development process. By way of example, embodiments of the present disclosure provide an AFEM composition. In some embodiments, the AFEM composition is deposited onto a patterned resist layer, where the patterned resist layer may include one or more inadvertently printed SRAFs (e.g., OPC artifact features). In accordance with various embodiments, the AFEM composition may be used to effectively "erase" the undesirable printed SRAFs within the resist layer, thereby mitigating potentially detrimental effects of such printed SRAFs within a resist layer. In some examples, the AFEM composition is deposited onto the patterned resist layer and fills voids, gaps, and/or other undesirable SRAF patterns which have been printed onto the resist layer. In various embodiments, the AFEM composition and related methods described herein serve to recover DoF, contrast, and process window that would otherwise have been lost due to the undesirable SRAFs printed within the resist layer. Those of skill in the art will readily appreciate that the methods described herein may be applied to a variety of other semiconductor layouts, semiconductor devices, and semiconductor processes to advantageously achieve similar benefits to those described herein without departing from the scope of the present disclosure.

Thus, one of the embodiments of the present disclosure described a method including coating a substrate with a resist layer. In various embodiments, after coating the substrate, the resist layer is patterned to form a main feature pattern and at least one sub-resolution assist feature (SRAF) pattern within the resist layer. In some embodiments, the main feature pattern includes resist sidewalls and a portion of a layer underlying the patterned resist layer. In various examples, a material composition (e.g., the AFEM composition) is deposited over the patterned resist layer and into each of the main feature pattern and the at least one SRAF pattern. Thereafter, a material composition development process is performed to dissolve a portion of the material composition within the main feature pattern and to expose the portion of the layer underlying the patterned resist layer.

In another of the embodiments, discussed is a method for semiconductor device fabrication including providing a resist-coated substrate and a mask including an integrated circuit (IC) design layout. By way of example, the resist-coated substrate is exposed, through the mask, to form a main feature pattern and an SRAF pattern within the resist layer. The main feature pattern includes a first resist surface and at least one other material surface (e.g., a surface of a layer underlying the patterned resist layer). In some embodiments, the SRAF pattern includes a second resist surface. In various embodiments, a material composition is deposited onto the first resist surface and the at least one other material surface of the main feature pattern and onto the second resist surface of the SRAF pattern. A development process may then be performed, for example, to remove the material composition from the at least one other material surface, while the material composition on the first and second resist surfaces remains on the first and second resist surfaces after the development process.

In yet other embodiments, discussed is a semiconductor device including a material layer and a patterned resist layer disposed on the material layer. In some embodiments, the patterned resist layer includes a main feature pattern and at least one optical proximity correction (OPC) artifact feature pattern within the resist layer. In various examples, the main feature pattern includes resist sidewalls. In some embodiments, a material composition is formed on exposed surfaces of the patterned resist layer including on the resist sidewalls of the main feature pattern and on resist surfaces within the at least one OPC artifact feature pattern. Additionally, an opening within the main feature pattern exposes a portion of a layer underlying the patterned resist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    coating a substrate with a resist layer;
    after coating the substrate, patterning the resist layer to form a main feature pattern and at least one sub-resolution assist feature (SRAF) pattern within the resist layer, wherein the main feature pattern includes resist sidewalls and a portion of a layer underlying the patterned resist layer;
    depositing a material composition over the patterned resist layer and into each of the main feature pattern and the at least one SRAF pattern defined within the patterned resist layer; and
    performing a material composition development process to dissolve a portion of the material composition within the main feature pattern and to expose the portion of the layer underlying the patterned resist layer.

2. The method of claim 1, wherein portions of the material composition in contact with exposed surfaces of the patterned resist layer bond to the exposed surfaces of the patterned resist layer.

3. The method of claim 2, wherein after performing the material composition development process, the portions of the material composition in contact with the exposed surfaces remain bonded to the exposed surfaces of the patterned resist layer.

4. The method of claim 1, wherein the depositing the material composition into the main feature pattern includes depositing the material composition on the resist sidewalls and on the portion of the layer underlying the patterned resist layer, and wherein the material composition bonds to the resist sidewalls.

5. The method of claim 4, wherein performing the material composition development process dissolves the material composition disposed on the portion of the layer underlying the patterned resist layer, while the material composition deposited on the resist sidewalls remains bonded to the resist sidewalls.

6. The method of claim 1, further comprising:
    providing a mask including a mask pattern, wherein the mask pattern includes a layout of the main feature pattern and the at least one SRAF pattern; and
    exposing the resist layer of the resist-coated substrate through the mask.

7. The method of claim 6, further comprising:
    wherein the exposing the resist layer forms a latent image of the main feature pattern and a latent image of the at least one SRAF pattern within the resist layer; and
    performing a resist development process to dissolve a portion of the resist layer, thereby forming the main feature pattern and the at least one SRAF pattern within the resist layer.

8. The method of claim 1, wherein the material composition bonds to resist surfaces of the at least one SRAF pattern.

9. The method of claim 1, wherein the material composition bonds to exposed surfaces of the patterned resist layer by way of at least one of a cross-linking bond, a non-covalent bond, and an entanglement bond.

10. A method of semiconductor device fabrication, comprising:
    providing a resist-coated substrate and a mask including an integrated circuit (IC) design layout;
    exposing the resist-coated substrate, through the mask, to form a patterned resist layer including a main feature pattern and a sub-resolution assist feature (SRAF) pattern within the resist layer, wherein the main feature pattern includes a first resist surface and at least one other material surface, and wherein the SRAF pattern includes a second resist surface;
    depositing a material composition onto the first resist surface and the at least one other material surface of the main feature pattern and onto the second resist surface of the SRAF pattern defined within the patterned resist layer; and
    performing a development process to remove the material composition from the at least one other material surface, while the material composition on the first and second resist surfaces remains on the first and second resist surfaces after the development process.

11. The method of claim 10, wherein the material composition bonds to the first and second resist surfaces by way of at least one of a cross-linking bond, a non-covalent bond, and an entanglement bond.

12. The method of claim 11, further comprising:
    forming the cross-linking bond, wherein the material composition includes a functional group selected from one of OH, epoxy, $RNH_2$, $R_2NH$, SH, COOH, OH, and $NH_2$.

13. The method of claim 12, wherein the forming the cross-linking bond further includes providing a reaction catalyst that causes the material composition to bond, by way of a cross-linker, to the first and second resist surfaces.

14. The method of claim 11, further comprising:
    forming the non-covalent bond, wherein the material composition includes at least one element or compound selected from OH, $RNH_2$, SH, $R_2NH$, F, $CF_3$, and Na.

15. The method of claim 11, further comprising:
    forming the entanglement bond, wherein the material composition includes an alkyl.

16. A semiconductor device, comprising:
    a material layer;
    a patterned resist layer disposed on the material layer, wherein the patterned resist layer includes a main feature pattern and at least one optical proximity correction (OPC) artifact feature pattern within the resist layer, wherein the main feature pattern includes resist sidewalls;

a material composition formed on exposed surfaces of the patterned resist layer including on the resist sidewalls of the main feature pattern and on resist surfaces of the at least one OPC artifact feature pattern defined by the patterned resist layer; and an opening within the main feature pattern which exposes a portion of a layer underlying the patterned resist layer.

17. The semiconductor device of claim 16, wherein the OPC artifact feature pattern includes a sub-resolution assist feature (SRAF) pattern.

18. The semiconductor device of claim 16, wherein the material layer includes one of a semiconductor layer, a conductive layer, an organic layer, and an insulating layer.

19. The semiconductor device of claim 16, wherein the main feature pattern includes a design corresponding to an integrated circuit (IC) feature and including one of an active region, a gate electrode, a source region, a drain region, a metal line, a via, a dielectric, and an opening for a bond pad.

20. The semiconductor device of claim 16, wherein material composition includes at least one selected from the group including OH, epoxy, $RNH_2$, $R_2NH$, SH, COOH, OH, $NH_2$, F, $CF_3$, Na, a cross-linker, and an alkyl.

* * * * *